United States Patent
Moehlmann et al.

(10) Patent No.: US 11,218,153 B1
(45) Date of Patent: Jan. 4, 2022

(54) CONFIGURABLE BUILT-IN SELF-TEST FOR AN ALL DIGITAL PHASE LOCKED LOOP

(71) Applicant: NXP B.V., Eindhoven (DE)

(72) Inventors: Ulrich Moehlmann, Moisburg (DE); Lars Henrik Heinbockel, Moisburg (DE); Torsten Gerhardt, Hamburg (DE); Christian Scherner, Hamburg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/084,525

(22) Filed: Oct. 29, 2020

(51) Int. Cl.
*H03L 7/099* (2006.01)
*G01R 31/3187* (2006.01)
*H03L 7/093* (2006.01)

(52) U.S. Cl.
CPC ........ *H03L 7/0992* (2013.01); *G01R 31/3187* (2013.01); *H03L 7/093* (2013.01); *H03L 2207/50* (2013.01)

(58) Field of Classification Search
CPC combination set(s) only.
See application file for complete search history.

(56) References Cited

U.S. PATENT DOCUMENTS

| | | | |
|---|---|---|---|
| 6,294,935 B1 | 9/2001 | Ott | |
| 7,254,755 B2* | 8/2007 | de Obaldia | H04B 17/0085 375/224 |
| 8,134,411 B2* | 3/2012 | Shi | H03L 1/022 331/1 A |
| 10,135,483 B2* | 11/2018 | Margomenos | H04B 7/0413 |
| 10,802,077 B1* | 10/2020 | Srinivasan | G11C 29/54 |
| 2007/0190952 A1* | 8/2007 | Waheed | H04B 1/0475 455/114.3 |
| 2008/0055008 A1* | 3/2008 | Staszewski | H03B 21/00 331/37 |
| 2008/0055009 A1* | 3/2008 | Lerner | H03B 21/00 331/37 |
| 2008/0055010 A1* | 3/2008 | Lerner | H03K 5/13 331/37 |
| 2008/0055014 A1* | 3/2008 | Tsfaty | H03B 19/00 332/127 |
| 2008/0072025 A1* | 3/2008 | Staszewski | G06F 9/30032 712/241 |
| 2008/0148119 A1* | 6/2008 | Huang | G06F 11/27 714/733 |
| 2008/0192876 A1* | 8/2008 | Dulger | H03L 7/1806 375/376 |
| 2008/0288845 A1* | 11/2008 | Tsfati | H03M 13/6306 714/748 |
| 2009/0004981 A1* | 1/2009 | Eliezer | H03F 1/3282 455/127.1 |
| 2009/0070568 A1* | 3/2009 | Shi | G06F 9/3875 712/237 |

(Continued)

FOREIGN PATENT DOCUMENTS

EP        1148340 A2    10/2001

*Primary Examiner* — Adam D Houston

(57) ABSTRACT

A built-in self-test (BIST) block is provided that is incorporated into an all-digital phase locked loop (ADPLL) located on chip with the ADPLL. The BIST performs testing functions without need for support external to the chip. Test setup, test control, and test evaluation are performed entirely on chip. The BIST provides information regarding success or failure of the testing and can provide error information regarding test cases that do not pass successfully.

20 Claims, 3 Drawing Sheets

(56) References Cited

U.S. PATENT DOCUMENTS

| | | | |
|---|---|---|---|
| 2009/0262877 A1* | 10/2009 | Shi | H03L 1/022 |
| | | | 375/376 |
| 2010/0135368 A1* | 6/2010 | Mehta | H04L 27/3881 |
| | | | 375/219 |
| 2010/0188148 A1* | 7/2010 | Mehta | H03F 1/3247 |
| | | | 330/149 |
| 2012/0252382 A1* | 10/2012 | Bashir | H03F 3/217 |
| | | | 455/114.3 |
| 2014/0032986 A1* | 1/2014 | Wan | G11C 29/40 |
| | | | 714/727 |
| 2015/0276919 A1* | 10/2015 | Matsumura | H01Q 1/3233 |
| | | | 342/175 |
| 2018/0299509 A1* | 10/2018 | Baker | G01R 31/31701 |
| 2020/0336151 A1* | 10/2020 | Olumuyiwa | H03L 7/18 |

* cited by examiner

CONFIGURABLE BUILT-IN SELF-TEST FOR AN ALL DIGITAL PHASE LOCKED LOOP

BACKGROUND

Field

This disclosure relates generally to phase locked loops, and more specifically, to a built-in self-test (BIST) for an all-digital phase locked loop allowing functional tests of analog components.

Related Art

Phase-locked loop (PLL) circuits and, in many applications, all-digital PLLs (ADPLL) are used in a wide variety of high frequency applications, including, for example, clock generation, clock clean-up circuits, local oscillators for high performance radio communication links, and ultra-fast switching frequency synthesizers in vector network analyzers. A PLL is a feedback system that combines a controlled oscillator and a phase comparator connected in a matter that the oscillator maintains a constant phase angle relative to a reference signal. An ADPLL incorporates a digitally-controlled oscillator (DCO) controlled by a digital control loop and feedback path that includes a time-to-digital converter and at least one divider. In a typical configuration, a PLL compares the phase of the reference signal to the phase of an adjustable feedback signal. When the comparison is in a steady state, and the output frequency and phase are matched to the incoming frequency and phase of a phase detector, the PLL is said to be locked.

Well-designed ADPLLs are characterized by high performance, but production testing and field testing of the ADPLL can be complex and resource intensive. Typical ADPLL production testing can include functional testing of the analog parts of the circuitry executed using testers external to a system on a chip (SoC) incorporating the ADPLLs. Support blocks on the ADPLL can impact the size of the ADPLL. In addition, with externally-controlled testing it is impossible to conduct testing in the field or by customers incorporating SoCs into their products. It is therefore desirable to provide a built-in self-test mechanism that provides a reliable test of an ADPLL and that is located completely on chip without need for external support.

BRIEF DESCRIPTION OF THE DRAWINGS

Embodiments of the present invention may be better understood by referencing the accompanying drawings.

The use of the same reference symbols in different drawings indicates identical items unless otherwise noted. The figures are not necessarily drawn to scale.

DETAILED DESCRIPTION

Figure 1:
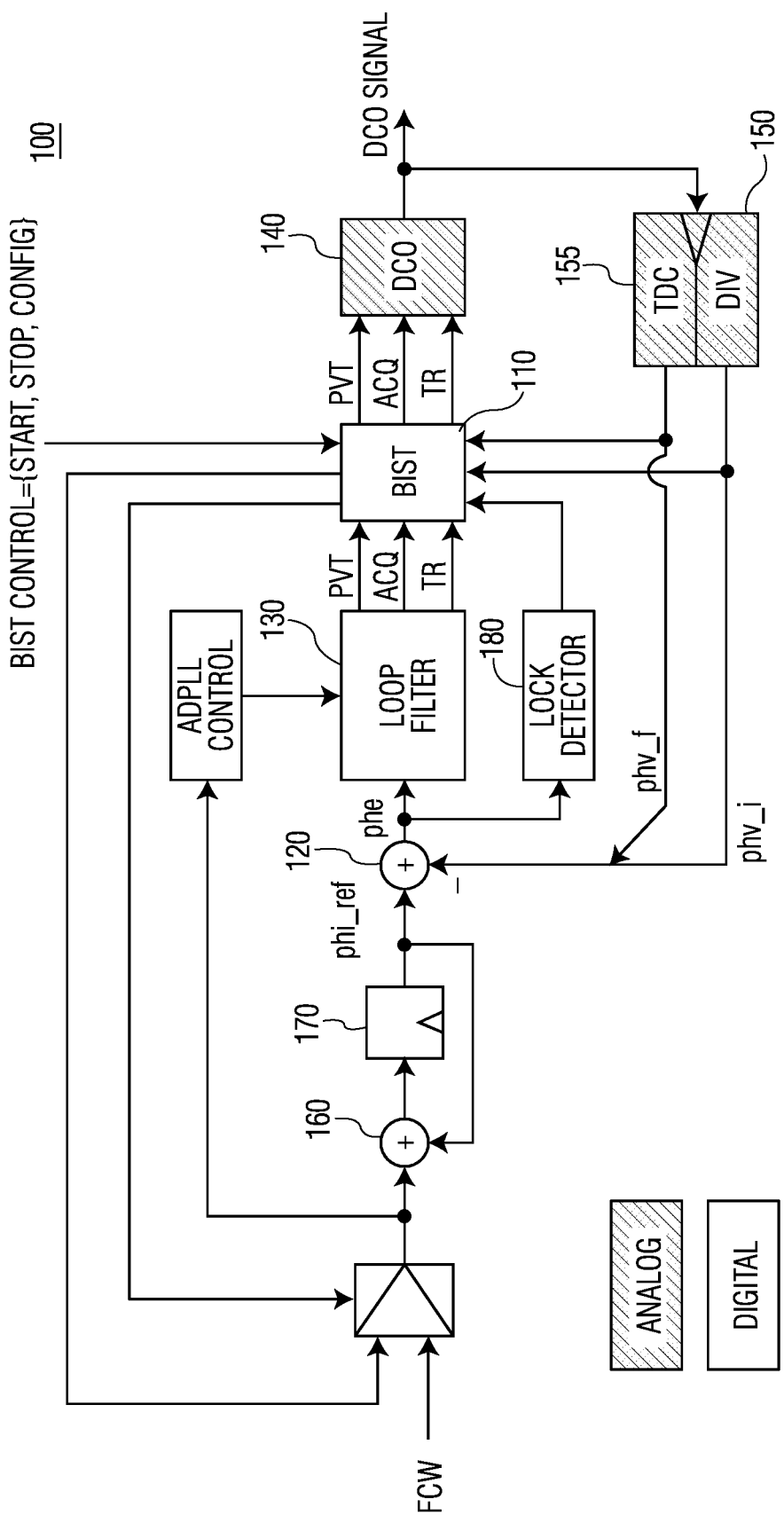
FIG. 1 is a simplified block diagram of an ADPLL 100 incorporating a BIST 110 in accordance with embodiments of the present invention.

Embodiments of the present invention provide a built-in self-test (BIST) block incorporated into an all-digital phase locked loop (ADPLL) that is located on chip with the ADPLL and can perform testing functions without need for external support. Test setup, test control, and test evaluation are performed entirely on chip. The BIST provides information regarding success or failure of the testing and can provide error information regarding test cases that do not pass successfully.

Embodiments of the BIST are configured to test functioning of the controlling loop of an ADPLL as well as the function of the analog components. Examples of tests that the BIST is configured to perform are: whether all digitally-controlled oscillator (DCO) control settings are available and provide frequencies for frequency steps in the expected range; overall frequency range of the DCO; lock range of the ADPLL, which is different from the frequency range of the DCO; operation of a time-to-digital converter (TDC) of the ADPLL; and operation of a divider of the ADPLL. Embodiments of the BIST can be configured for the desired application, including, for example, production test or characterization, field testing, and operational testing. During production test or characterization, a complete suite of tests can be performed as defined by the testing program. For field functional testing, the tests can be integrated with SoC startup procedures, either as a full test of the ADPLL or a subset of tests. During operational testing, for example during system idle time, only a subset of the BIST can be used. If the BIST only tests the ADPLL within the operational range of the loop, then overclocking of DSPs is avoided. Further, to address non-linearity of DCO behavior, a linearized approximation is provided that is sufficiently accurate to determine whether the DCO is fully functioning.

Well-designed ADPLLs are characterized by high performance, but production testing and field testing of the ADPLL can be complex and resource intensive. Typical ADPLL production testing can include functional testing of the analog parts of the circuitry executed using testers external to a system on a chip (SoC) incorporating the ADPLLs.

In some instances, automated test equipment (ATE) can be coupled to a test support block (TSB) of the ADPLL, which is configured by a test program of the ATE. The TSB can initiate the test, switch the ADPLL to a test mode, apply the test to the ADPLL, store the results of the test as raw data at the ATE. Postprocessing is then performed to determine whether the test was successful.

This approach requires a significant amount of internal memory to store test vectors and test result, which consequently impacts the on-chip area of the ADPLL. Further, tests can be organized in clusters, which results in configurations, execution of tests, and reading results being linked to size and number of capacitor banks in the DCO. Overall test time is determined by the number of clusters, time for communicating test vectors to the TSB, and reading test results from the TSB, and raw data postprocessing. In typical cases, when testing is controlled by the TSB, testing time can be between 600 and 800 ms. While multiple tests can be performed concurrently using a TSB, the length of time for communication (i.e., predominantly serial communication) and data postprocessing extends production test time, especially if multiple instances of ADPLLs are built into an SoC. This extended time for performing tests through the TSB can also result in environmental factors changing during the course of testing (e.g., temperature changes). Such environmental changes can cause, for example, shifting of a center frequency of the oscillator due to temperature sensitivity. This can be compensated for, but such compensation can result in even more extended testing time.

Another disadvantage of the externally controlled TSB test programs is that it is impossible to conduct ADPLL tests in the field or by customers incorporating SoCs into their products. Current automotive safety requirements are directing that testing can be performed during operation of products incorporating ADPLLs. While, in theory, a digital signal processor can be used to conduct such testing, this is not practically possible if the clock of the DSP is derived from an ADPLL under test (e.g., the ADPLL may cause overclocking of the DSP and thereby cause timing violations) and does not allow testing of the ADPLL during boot time. Further, functional testing may involve monitoring an internal clock source for operation within specifications. Phase noise performance degradation can result, if a control bit for the DCO does not provide a correct response. Correct function of control bits is therefore a necessary condition so that phase noise performance is according to specification. Traditional solutions do not provide an ability to monitor an ADPLL in general or a DCO specifically within an operational range.

FIG. 1 is a simplified block diagram of an ADPLL 100 incorporating a BIST 110 in accordance with embodiments of the present invention. ADPLL 100 can be used for local oscillator signal generation and generation of other frequencies required for a system on a chip (SoC) (e.g., sampling clock of an ADC or clock of a digital signal processor). The ADPLL can be used to regulate radio transmission frequency. Basic building blocks of an ADPLL are a phase comparator 120, a loop filter 130, a digitally-controlled oscillator (DCO) 140, and a divider 150 with a time-to-digital converter (TDC) 155. Negative feedback from DCO 140 through divider 150/TDC 155 to phase comparator 120 forces the phase comparator to produce an error signal "phe" proportional to a phase difference between an input clock signal phi_ref (a reference signal) and the feedback signal (one of phv_i and phv_f). The error signal is then low pass filtered through loop filter 130 to generate control inputs for process-voltage-temperature (PVT), acquisition (ACQ), and tracking (TR) capacitor banks in the DCO. As illustrated, these control inputs are provided to BIST 110, which can pass or modify the control inputs and provide them to DCO 140.

ADPLL 100 is a mixed signal system that incorporates both analog (illustrated as white filled) and digital (illustrated as hatch filled) functional blocks. Processing takes place completely in the digital domain. A reference clock is generated by a crystal oscillator, for example, at 60 MHz. A phase ramp is generated by an accumulator 160 that is incremented by a frequency control word (FCW) with each reference clock period. Transition from the frequency domain to the phase domain takes place through integration (e.g., a combination of accumulator 160, register 170, and the feedback path coupling them). If the FCW is constant, the integration provides a ramp signal as reference phase phi_ref. Phase comparator 120 compares phi_ref with a feedback phase provided by divider 150 and TDC 155 by subtraction to generate the error signal, or phase difference, phe. The error signal is provided to loop filter 130.

Loop filter 130 is a linear filter configured to filter out the error signal and to smooth and generate the control signals for DCO 140. The design of the loop filter contributes to settling time, interference suppression, and stability. In ADPLL implementations not including a BIST (e.g., BIST 110), the control signals (PVT, ACQ, and TR) are provided directly to the digitally-controlled oscillator. In some implementations of an ADPLL not including the BIST, a test multiplexer can be present in the illustrated BIST location, which allows access and control to a test support block (TSB).

Figure 2:
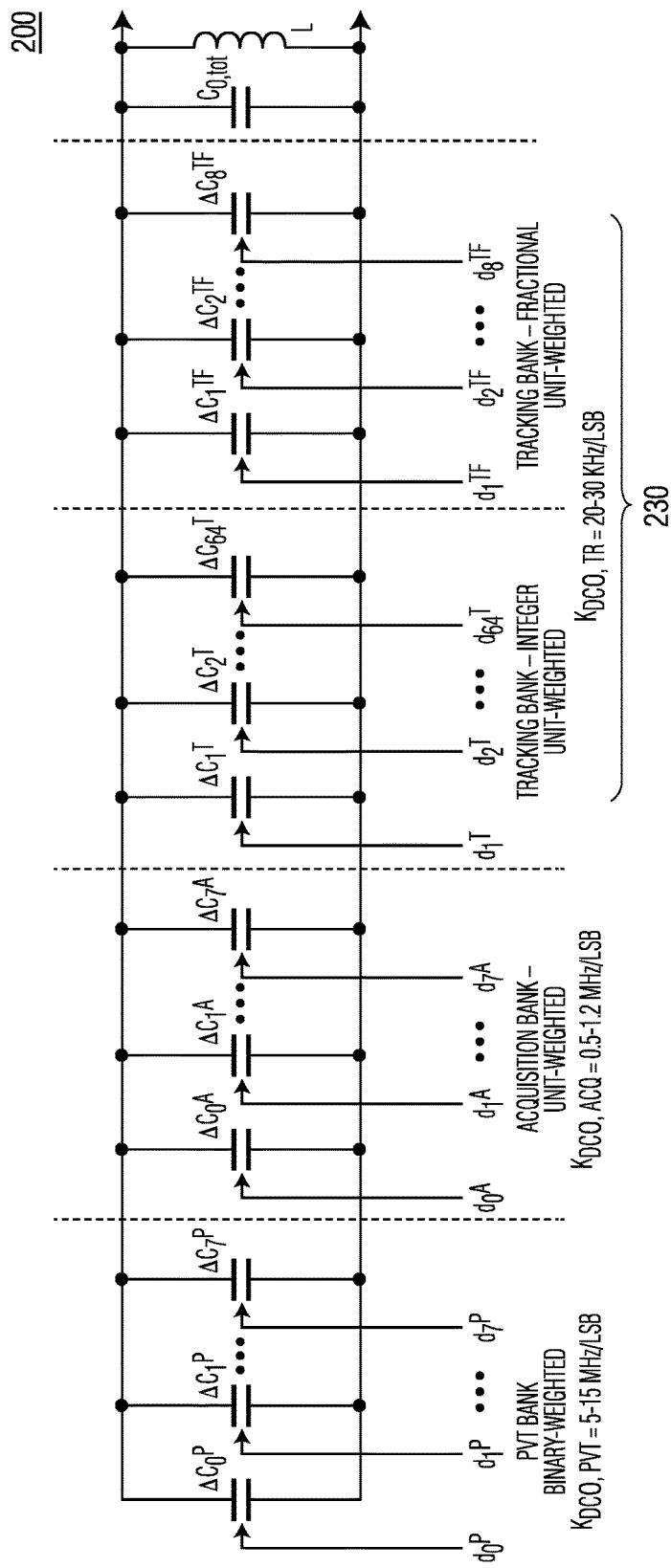
FIG. 2 is a simplified block diagram illustrating an example of a portion of a digitally-controlled oscillator that receives the control signals from a loop filter or a BIST.

FIG. 2 is a simplified block diagram illustrating an example of a portion of a digitally-controlled oscillator that receives the control signals from loop filter 130 or BIST 110. A digitally-controlled oscillator incorporates programmable capacitor banks in an inductor-capacitor (LC) tank circuit. Quantized capacitance is used for frequency tuning of the DCO.

There are three operational modes of the DCO: process-voltage-temperature (PVT) calibration mode, acquisition mode (ACQ), and tracking mode (TR). During lock of the ADPLL, the three modes get active sequentially. First, the PVT mode is used to tune roughly to the desired frequency and compensates for process, voltage, and temperature variation. After a defined time interval sufficient for the PVT mode to settle, the loop switches to ACQ mode to tune closer to the desired frequency. Subsequently, the TR mode is used to settle into the required phase and frequency. ACQ mode is intermediate and reduces the necessary tuning range of the TR bank and hence reduces the chip area of the ADPLL. In addition, time to lock is decreased—all compared to an implementation where the loop directly switches from PVT to TR mode without ACQ mode.

Fractional bits undergo high-speed dithering to increase frequency resolution. The division of the DCO capacity ($K_{DCO}$) among the capacitor banks is also illustrated.

A desired oscillating frequency is acquired step-by-step by traversing through the three capacitor banks (PVT bank 210, ACQ bank 220, and TR banks 230) with progressively finer resolution. At the end of the PVT and ACQ modes, a terminating mode capacitor state is frozen and constitutes a new center frequency from which the frequency offsets, during subsequent modes, are referenced. As discussed above, loop filter 130 outputs are divided into PVT, ACQ, and TR. In order to lock ADPLL 100, the three modes are activated sequentially.

BIST 110 is implemented between loop filter 130 and DCO 140. The BIST also has access to output from lock detector 180, which provides information to the BIST regarding whether the PLL is in lock or not. Further, BIST 110 is configured to set the FCW in test mode. Embodiments of BIST 110 can support several test modes (e.g., DCO test, TDC/Divider test, and Lock test).

Figure 3:
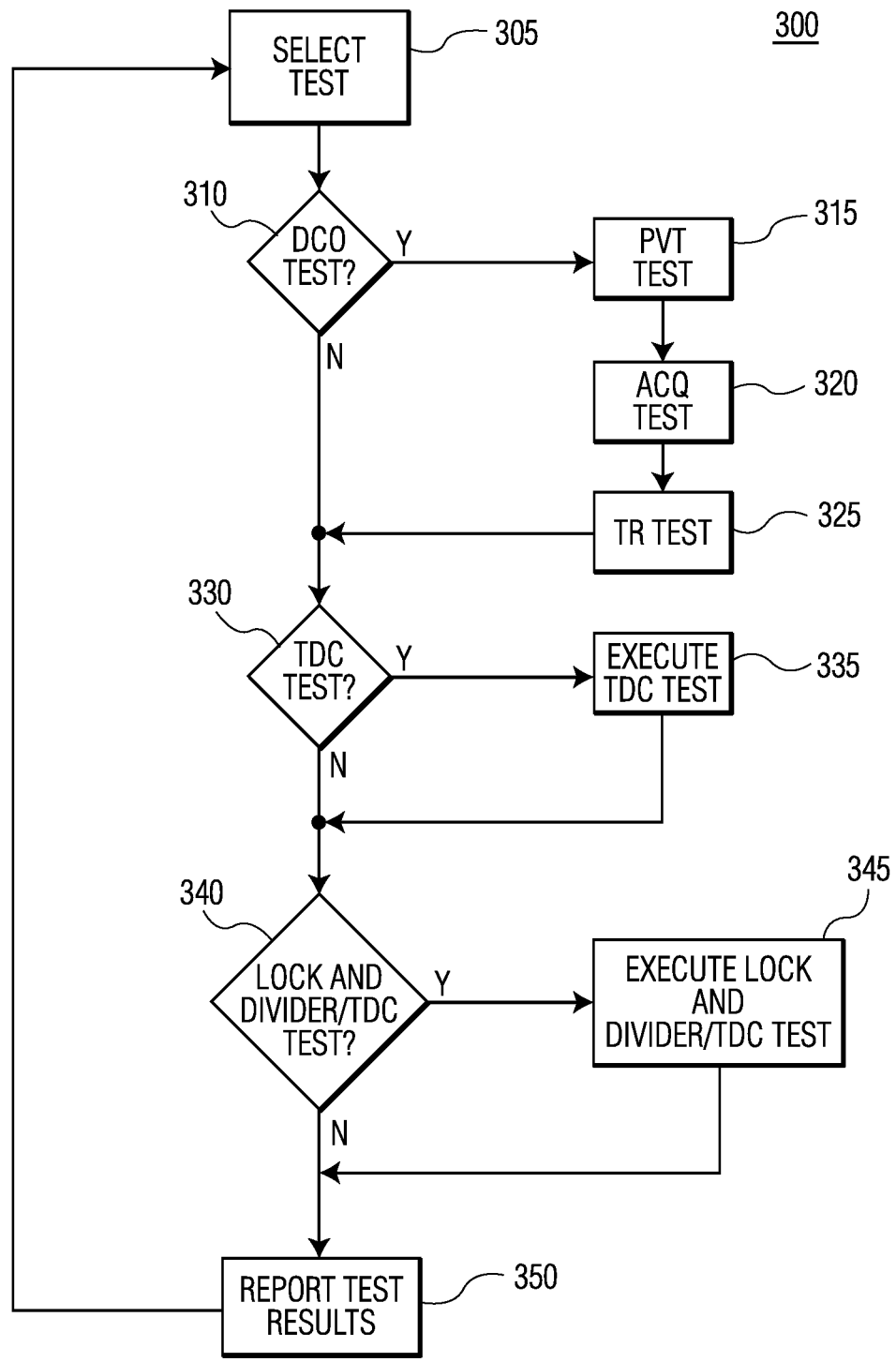
FIG. 3 is a simplified flow diagram illustrating a set of steps followed by a BIST for conducting tests of an ADPLL in accordance with embodiments of the present invention.

FIG. 3 is a simplified flow diagram illustrating a set of steps followed by BIST 110 for conducting tests of an ADPLL in accordance with embodiments of the present invention. As an initial step, the BIST selects a test or set of tests to perform (305). The selection of which test to perform can be provided by a processor coupled to the ADPLL in the SoC, either initiated automatically or by an external source.

One test mode that can be selected is a DCO test mode (310). DCO test mode tests the DCO controls (PVT, ACQ, and TR) through a PVT test (315), an ACQ test (320), and a TR test (325). Testing the binary-weighted capacitor banks of the DCO has historically required significant external resources and computing effort. Embodiments of the BIST are configured to perform these tests while consuming as little additional physical area in each ADPLL as practical. The computational effort to test the capacitances of the DCO is dependent on the different capacity sizes, as will be discussed more fully below.

For testing purposes, the loop filter output is replaced by test vectors programmed into the BIST. Frequency is measured by differentiating feedback phase versus time. For example, two states of the TDC/Divider are measured over time and subtracted from one another. If the difference is divided by the time between the measurements, this provides the DCO frequency. But if a measurement interval is constant, then it can be sufficient for the test implementation to examine the difference between measurement results, which saves hardware implementation of a division.

A DCO implemented as an LC oscillator which is controlled by capacitor banks, as discussed above, provides an oscillation frequency that follows a $1/\sqrt{LC}$ behavior. Thus, when tuning the capacitor banks, the oscillation frequency has generally non-linear behavior vis-à-vis the control settings. But if tuning steps and the tuning range of a capacitor bank are sufficiently small, then in that range the operation of the capacitor bank can be linearized and therefore simplify behavioral analysis. The ACQ bank behavior in the operational range is fairly linear. Frequency changes between individual capacities is very small over the frequency range. Similarly, the TR bank behavior is almost linear over the operational range. Therefore, constant limits can be set for the ACQ and TR cap bank steps in the BIST.

The PVT bank by its nature covers the process, voltage, and temperature spread of the DCO as well as the desired tuning range of the DCO. The oscillator can have a tuning range of ±30% or more, and over that range the tuning behavior of the PVT bank is not linear. One solution providing a linear approximation of the tuning behavior for the PVT banks is to use a stepwise approach for limit settings. Different limits would be defined for certain controlling intervals of the PVT bank. Alternatively, an algorithm could be applied for the limit settings such that one limit is derived by a factor from an earlier limit (e.g., 1.5 or 2). These limits would be read from a memory. But the behavior of the oscillator would need to be accurately known and provided to the BIST in order to utilize this approach. Such approaches require significant computation resources or significant memory, which consumes area on a chip.

Embodiments of the present invention utilize an approximation that results in a linearization that reduces resource consumption of the techniques described above while providing accurate PVT testing results. Derivation of the approximation is discussed below.

Frequency of an LC-oscillator in the DCO is determined by Thomson's oscillation equation:

$$f_{DCO} = \frac{1}{2\pi\sqrt{LC}} = \tag{1.1}$$

$$\frac{1}{2\pi\sqrt{L(C_0 + \Delta C_{PVT}(PVT) + \Delta C_{ACQ}(ACQ) + \Delta C_{TR}(TR))}}$$

If only the PVT bank is in use and all other caps are off, then formula (1.1) reduces to $$f_{DCO} = \frac{1}{2\pi\sqrt{L(C_0 + \Delta C_{PVT}(PVT))}} \tag{1.2}$$

From formula (1.2), the ratio between two PVT-cap-settings can be derived:

$$\frac{\Delta C_{PVT}(PVT_1)}{\Delta C_{PVT}(PVT_2)} = \frac{\frac{1}{f_{dco,PVT_1}^2} - \frac{1}{f_{dco,C_0}^2}}{\frac{1}{f_{dco,PVT_2}^2} - \frac{1}{f_{dco,C_0}^2}} \tag{1.3}$$

$f_{DCO,C_0}$=DCO frequency for the case that all cap banks are off which is the maximum frequency of the oscillator.

$f_{DCO,PVT_{1/2}}$=DCO frequencies with PVT setting 1 or 2.

Formula (1.3) compares two capacitances of the resonant circuit with one another. A similar calculation can be performed for ACQ and TR banks not being switched off but with a constant value. These would provide a relation similar to formula (1.1) but with a different $f_{dco,C_0}$.

The frequencies can be represented as counter results from divider status difference:

$$f_{DCO} \cdot T_{measure} = \Delta divTDCstate \rightarrow f_{DCO} = \frac{\Delta divTDCstate}{T_{measure}} \tag{1.4}$$

That is, the difference of TDC 150/Divider 155 states $\Delta divTDCstate$ divided by the measurement time $T_{measure}$ provides a measure of the DCO frequency, $f_{DCO}$.

For the following approximations, it is assumed that $T_{measure}$, the measurement time, is constant. The term $\Delta divTDCstate$ is the difference between two combined divider and TDC states, which is considered as a counter state cnt from now on. If formula (1.4) is inserted in formula (1.3), this results in $$\frac{\Delta C_{PVT}(PVT_1)}{\Delta C_{PVT}(PVT_2)} = \frac{\frac{1}{cnt_{dco,PVT_1}^2} - \frac{1}{cnt_{dco,C_0}^2}}{\frac{1}{cnt_{dco,PVT_2}^2} - \frac{1}{cnt_{dco,C_0}^2}} \tag{1.5}$$

Equation (1.5) is then expanded by $cnt_{dco,PVT_1}^2 \cdot cnt_{dco,PVT_2}^2 \cdot cnt_{dco,C_0}^2$:

$$\frac{\Delta C_{PVT}(PVT_1)}{\Delta C_{PVT}(PVT_2)} = \frac{\left(\frac{1}{cnt_{dco,PVT_1}^2} - \frac{1}{cnt_{dco,C_0}^2}\right) \left(cnt_{dco,PVT_1}^2 \cdot cnt_{dco,PVT_2}^2 \cdot cnt_{dco,C_0}^2\right)}{\left(\frac{1}{cnt_{dco,PVT_2}^2} - \frac{1}{cnt_{dco,C_0}^2}\right) \left(cnt_{dco,PVT_1}^2 \cdot cnt_{dco,PVT_2}^2 \cdot cnt_{dco,C_0}^2\right)} = \tag{1.6}$$

$$\frac{cnt_{dco,PVT_2}^2 \cdot cnt_{dco,C_0}^2 - cnt_{dco,PVT_1}^2 \cdot cnt_{dco,PVT_2}^2}{cnt_{dco,PVT_1}^2 \cdot cnt_{dco,C_0}^2 - cnt_{dco,PVT_1}^2 \cdot cnt_{dco,PVT_2}^2} =$$

$$\frac{cnt_{dco,PVT_2}^2}{cnt_{dco,PVT_1}^2} \cdot \frac{cnt_{dco,C_0}^2 - cnt_{dco,PVT_1}^2}{cnt_{dco,C_0}^2 - cnt_{dco,PVT_2}^2} =$$

$$\frac{cnt_{dco,PVT_2}^2}{cnt_{dco,PVT_1}^2} \cdot \frac{cnt_{dco,C_0}^2 + cnt_{dco,PVT_1}^2}{cnt_{dco,C_0}^2 + cnt_{dco,PVT_2}^2} \cdot \frac{cnt_{dco,C_0}^2 - cnt_{dco,PVT_1}^2}{cnt_{dco,C_0}^2 - cnt_{dco,PVT_2}^2}$$

In one embodiment, the PVT bank is a binary-weighted implementation which results in caps being scaled by factor of 2. In this embodiment, the factor $$\frac{cnt_{dco,PVT_2}^2}{cnt_{dco,PVT_2}^2} \cdot \frac{cnt_{dco,C_0} + cnt_{dco,PVT_1}^2}{cnt_{dco,C_0} + cnt_{dco,PVT_2}^2}$$

of equation (1.6) is approximately constant and was found to be 1 to 1.2. For the cap ratio, the term $$\frac{cnt_{dco,C_0} - cnt_{dco,PVT_1}^2}{cnt_{dco,C_0} - cnt_{dco,PVT_2}^2}$$

is dominant and between 1.8-2.2, or approximately equal to 2. This approximation results in the following limit for counter result differences:

$$\frac{cnt_{dco,C_0} - cnt_{dco,PVT_1}^2}{cnt_{dco,C_0} - cnt_{dco,PVT_2}^2} \approx 2 \rightarrow \quad (1.7)$$

$$cnt_{dco,C_0} - cnt_{dco,PVT_1}^2 \approx 2 \cdot (cnt_{dco,C_0} - cnt_{dco,PVT2}^2) \rightarrow$$

$$\left| cnt_{dco,C_0} - cnt_{dco,PVT_1}^2 - 2 \cdot (cnt_{dco,C_0} - cnt_{dco,PVT2}^2) \right| < PVT_{limit}$$

In calculating the limit for counter result differences, the above approximation results in avoiding hardware implementation of multipliers or dividers. The factor of 2 is a binary shift operation and avoids area expensive multiplier implementation. To determine whether the PVT capacitors are behaving within tolerances during PVT test (315), a count at a first PVT capacitance can be taken and then shifted and compared to a count of a second PVT capacitance. If the difference in the result is less than the tolerance $PVT_{limit}$, then the test is satisfied. The inaccuracy of neglecting the factor 1-1.2 can be taken into consideration when defining the limits. Upper and lower limits can also be defined to perform this comparison.

The tests for ACQ (320) and TR (325) banks are not as complicated as that for the PVT capacitances, since just the difference between the frequency before and after connecting another capacitor should be checked against an upper and lower bound. This is performed using equation (1.4) and measured counter results. In addition to the linear approximation discussed above, layout constraints and process variations in the capacitor banks can vary the step sizes to an extent. Therefore, a normalization algorithm may need to be applied to the individual step results. A test algorithm can resemble those applied for testing of an analog-to-digital converter (e.g., integral nonlinearity and differential nonlinearity), describing the integral and differential non-linearity of the steps. Subsequent to normalization, the same limits for the counter results of the ACQ and TR banks can be defined.

A TDC test can be selected (330). Execution of the TDC test (335) also involves the capacitor bank. The TDC measures the time between a reference edge and a DCO clock edge, or a DCO-related clock edge if the DCO signal is divided in the TDC. During the capacitor bank test, the phase between the reference edge and the DCO edge will be fading. All phase relations will occur, and are detected, whether each bit of the TDC output can switch from 1 to 0 and vice versa. For each bit that performs this switch, an operation flag is set. If all bits set a flag, then the test is successful. In this manner, a determination is made as to whether the TDC has a stuck 0 or 1 failure.

A Lock Range and Divider/TDC test is also selectable by an embodiment of the present invention (340). Execution of the Lock Range and Divider/TDC test (345) is combined into one operation. For the lock range test, the FCW is provided by the BIST instead of an external control. Starting from a lowest FCW, the BIST applies a predefined settling time for the ADPLL and observes the lock bit of lock detector 180. The lock detector examines limits of the phase error. In lock, a phase error variation will be within a small range. Other types of lock detectors can examine a phase difference, which can provide more information than examining only frequency. In a system lock state, the differentiated Divider/TDC status is related to the FCW. In some circumstances, they may be identical. In another example of a lock detector, a minimum and maximum operation frequency of the DCO can be determined by analyzing the outputs of the divider and TDC. The frequency range is different from the lock range. But for safe and robust operation over the range of process, voltage, and temperature variations, there should be sufficient margin between operation range of the DCO and the guaranteed lock range. In these manners, the divider/TDC combinations can be functionally tested. Not only stuck bit failures are covered, but also timing failures of the divider or TDC can be identified.

Once the selected tests have completed, BIST 110 can report the test results (350). Reporting the test results can involve providing, for example, pass/fail information of the set of tests executed for functional safety requirement compliance. This information can be provided to a system controller that can then respond to the success or failure of the testing. In addition, during production testing, a characteristic pattern that includes pass/fail information for each test can be provided to an ATE system for debugging the device, along with desired raw data associated with the tests.

Embodiments provide a BIST circuit associated with each ADPLL in an SoC. By using these BISTs, aspects of the performance of the ADPLLs can be checked during production, incorporation in a system, and in the field. In the field performance checks can be reported to processors within the SoC, or coupled to the SoC, for response by the system in accordance with safety standards. While production checks can be used to determine whether the ADPLL is manufactured within appropriate tolerances.

By now it should be appreciated that there has been provided and all-digital phase-locked loop (ADPLL) circuit that includes a digitally-controlled oscillator circuit (DCO) configured to generate an output signal in response to a set of input signals, and a built-in self-test circuit (BIST), coupled to the inputs of the DCO, and configured to provide the set of input signals to the DCO.

In one aspect of the above embodiment, the ADPLL further includes a frequency divider circuit, coupled to the output of the DCO and an input of the BIST, a phase comparator circuit coupled to the output of the frequency divider circuit, and a loop filter circuit, coupled to the output of the phase comparator circuit and an input to the BIST. The frequency divider circuit is configured to generate a divider output signal that is a desired frequency from the DCO output signal. The phase comparator circuit is configured to compare the divider output signal to a reference phase and generate a phase difference signal corresponding to a phase difference between the divider output and the reference phase. The loop filter circuit is configured to generate a set of input signals for the BIST using the phase difference signal. In a further aspect, in a first operational mode, the BIST is configured to provide the set of input signals for the BIST to the set of input signals to the DCO. In another further aspect, in a second operational mode, the BIST is configured to generate one or more test signals and provide the one or more test signals as members of the set of input signals to the DCO.

In still a further aspect, the ADPLL further includes a time-to-digital converter (TDC) circuit, coupled to the output of the DCO and an input of the BIST. The TDC is configured to measure a time interval between a reference edge and an edge of a DCO-related signal and output a time signal corresponding to the measured time interval. In the second operational mode, the BIST is further configured to detect whether each bit of the TDC output can switch values from a zero to a one and from a one to a zero, and record results of this detecting.

In another further aspect, the ADPLL further includes a TDC coupled to the output of the DCO and an input of the BIST, and a lock detection circuit coupled to the output of the phase comparator circuit and an input of the BIST. The TDC is configured to measure a time interval between a reference edge and an edge of a DCO-related signal and output a time signal corresponding to the measured time interval. The lock detection circuit is configured to detect when the ADPLL is locked and provide a lock signal to the BIST when the ADPLL is locked. In the second operational mode, the BIST is further configured to provide a minimum and a maximum control word to the DCO circuit, receive the divider output signal from the frequency divider circuit, receive the time signal from the TDC circuit, and determine whether the lock signal is set and analyze the outputs from the TDC circuit and divider circuit.

In yet another further aspect, the ADPLL further includes a TDC coupled to the output of the DCO and an input of the BIST, and the DCO circuit further includes an oscillator and a plurality of capacitor banks that control the output frequency of the oscillator. The TDC is configured to measure a time interval between a reference edge and an edge of a DCO-related signal and output a time signal corresponding to the measured time interval. In the second operational mode, the BIST is further configured to provide a first set of test signals to the DCO, receive in response to the first set of test signals a first divider output signal from the divider circuit and a first time signal from the TDC circuit, provide a second set of test signals to the DCO, receive in response to the second set of test signals a second divider output signal from the divider circuit and a second time signal from the TDC circuit, and determine a frequency difference of the DCO using the first divider output, the first time signal, the second divider output, and the second time signal.

In still a further aspect, the plurality of capacitor banks includes an acquisition capacitor bank and one or more tracking capacitor banks, the first and second set of test signals are configured to test a target capacitor bank that includes an acquisition capacitor bank or one of the tracking capacitor banks, a difference between the first and second set of test signals is set such that a difference in response to the DCO to the first and second set of test signals is linear, and a normalized value of the frequency difference of the DCO is compared by the BIST against a predetermined constant value. In yet another further aspect, the plurality of capacitor banks includes a process-voltage-temperature capacitor bank, the first and second set of test signals are configured to test a target capacitor bank that includes the process-voltage-temperature capacitor bank, and the BIST is further configured to measure a first count (C1) from the TDC circuit and divider circuit when all capacitor banks are off, a second count (C2) from the TDC circuit and divider circuit in response to the first set of test signals, and a third count (C3) from the TDC circuit and divider circuit in response to the second set of test signals, and determine whether (C1−C2)−2*(C1−C3) is less than a predetermined threshold.

Another embodiment provides a system on a chip (SoC) that includes an ADPLL circuit including a DCO configured to generate an output signal in response to a set of input signals, and a BIST coupled to the inputs of the DCO and configured to provide the set of input signals to the DCO, and logic coupled to the BIST and configured to initiate BIST-based testing of the ADPLL and receive data associated with results of the BIST-based testing of the ADPLL.

In one aspect of the above embodiment, the ADPLL further includes a frequency divider circuit coupled to the output of the DCO and an input of the BIST, a phase comparator circuit coupled to the output of the frequency divider circuit, and a loop filter circuit coupled to the output of the phase comparator circuit and inputs to the BIST. The frequency divider circuit is configured to generate a divider output signal that is a desired frequency from the DCO output signal. The phase comparator circuit is configured to compare the divider output signal to a reference phase and generate a phase difference signal corresponding to a phase difference between the divider output and the reference frequency. The loop filter circuit is configured to generate a set of input signals for the BIST using the phase difference signal. In a further aspect, in a first operational mode, the BIST is configured to provide the set of input signals for the BIST to the set of input signals to the DCO. In another further aspect, and a second operational mode, the BIST is configured to generate one or more test signals and provide the one or more test signals as members of the set of input signals to the DCO.

In a further aspect, the ADPLL further includes a TDC circuit coupled to the output of the DCO and an input of the BIST. The TDC circuit is configured to measure a time interval between a reference edge and an edge of a DCO-related signal and output a time signal corresponding to the measured time interval. In the second operational mode, the BIST is further configured to detect whether each bit of the TDC output can switch values from a zero to a one and from a one to a zero, and record results of that detecting.

In another further aspect, the ADPLL further includes a TDC circuit coupled to the output of the DCO and an input of the BIST, and a lock detection circuit coupled to the output of the phase comparator circuit and an input of the BIST. The TDC is configured to measure a time interval between a reference edge and an edge of a DCO-related signal and output a time signal corresponding to the measured time interval. The lock detection circuit is configured to detect when the ADPLL is locked and provide a lock signal to the BIST when the ADPLL is locked. In the second operational mode, the BIST is further configured to provide a minimum and a maximum frequency control word (FCVV) to the ADPLL circuit, receive the divider output signal from the frequency divider circuit, receive the time signal from the TDC circuit, and determine whether the clock signal is set and analyze the outputs from the TDC circuit and divider circuit.

In another further aspect, the ADPLL further includes a TDC circuit coupled to the output of the DCO and an input of the BIST, and a lock detection circuit coupled to the output of the phase comparator circuit and an input of the BIST. The TDC is configured to measure a time interval between a reference edge and an edge of a DCO-related signal and output a time signal corresponding to the measured time interval. The lock detection circuit is configured to detect when the ADPLL is locked and provide a lock signal to the BIST when the ADPLL is locked. In the second operational mode, the BIST is further configured to provide a minimum and a maximum control word to the DCO circuit, receive the divider output signal from the frequency divider circuit, receive the time signal from the TDC circuit, and analyze the outputs from the TDC circuit and divider circuit to determine the minimum and maximum operation frequency of the DCO. This frequency range is different from the lock range. For safe and robust operation over all possible process, voltage and temperature variations there should be sufficient margin between operation range of the DCO and the guaranteed lock range of the system In still another further aspect, the ADPLL further includes a TDC circuit coupled to the output of the DCO and an input of the BIST, and the DCO circuit further includes an oscillator and a plurality of capacitor banks that control the output frequency of the oscillator. The TDC is configured to measure a time interval between a reference edge and an edge of a DCO-related signal and output a time signal corresponding to the measured time interval. In the second operational mode, the BIST is further configured to provide a first set of test signals to the DCO, receive in response to the first set of test signals a first divider output signal from the divider circuit and a first time signal from the TDC circuit, provide a second set of test signals to the DCO, receive in response to the second set of test signals a second divider output signal from the divider circuit and a second time signal from the TDC circuit, and determine a frequency difference of the DCO using the first divider output, the first time signal, the second divider output, and the second time signal.

In still a further aspect, the plurality of capacitor banks includes an acquisition capacitor bank and one or more tracking capacitor banks, the first and second set of test signals are configured to test a target capacitor bank that includes one of the acquisition capacitor bank or one of the tracking capacitor banks, a difference between the first and second set of test signals is set such that a difference in response to the DCO to the first and second set of test signals is linear, and a normalized value of the frequency difference of the DCO is compared by the BIST against a predetermined constant value. In yet another further aspect, the plurality of capacitor banks includes a process-voltage-temperature capacitor bank, the first and second set of test signals are configured to test a target capacitor bank that includes the process-voltage-temperature capacitor bank, and the BIST is further configured to measure a first count (C1) from the TDC circuit and divider circuit when all capacitor banks are off, a second count (C2) from the TDC circuit and divider circuit in response to the first set of test signals, and a third count (C3) from the TDC circuit and divider circuit in response to the second set of test signals, and determine whether (C1−C2)−2*(C1−C3) is less than a predetermined threshold.

In another aspect of the above embodiment, the logic is configured to initiate BIST-based testing of the ADPLL upon initialization of the SoC. In yet another aspect, the logic or, if available, a DSP or other type of embedded processor in the SoC, is configured to initiate BIST-based testing of the ADPLL during in-field testing of the SoC.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

It is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An all-digital phase-locked loop (ADPLL) circuit comprising:
    a digitally-controlled oscillator circuit (DCO) configured to generate an output signal in response to a set of input signals;
    a built-in self-test circuit (BIST), coupled to the inputs of the DCO, and configured to provide the set of input signals to the DCO.

2. The ADPLL of claim 1 further comprising:
    a frequency divider circuit, coupled to the output of the DCO and an input of the BIST, and configured to generate a divider output signal that is a desired frequency from the DCO output signal;
a phase comparator circuit, coupled to the output of the frequency divider circuit, and configured to
compare the divider output signal to a reference phase, and
generate a phase difference signal corresponding to a phase difference between the divider output and the reference phase; and
a loop filter circuit, coupled to the output of the phase comparator circuit and an input to the BIST, and configured to generate a set of input signals for the BIST using the phase difference signal.

3. The ADPLL of claim 2, wherein, in a first operational mode, the BIST is configured to provide the set of input signals for the BIST to the set of input signals to the DCO.

4. The ADPLL of claim 2, wherein, in a second operational mode, the BIST is configured to
generate one or more test signals; and
provide the one or more test signals as members of the set of input signals to the DCO.

5. The ADPLL of claim 4 further comprising:
a time-to-digital converter (TDC) circuit, coupled to the output of the DCO and an input of the BIST, and configured to measure a time interval between a reference edge and an edge of a DCO-related signal and output a time signal corresponding to the measured time interval; and
wherein, in the second operational mode, the BIST is configured to
detect whether each bit of the TDC output can switch values from a zero to a one and from a one to a zero, and
record results of said detecting.

6. The ADPLL of claim 4 further comprising:
a time-to-digital converter circuit (TDC), coupled to the output of the DCO and an input of the BIST, and configured to measure a time interval between a reference edge and an edge of a DCO-related signal and output a time signal corresponding to the measured time interval;
a lock detection circuit, coupled to the output of the phase comparator circuit and an input of the BIST, and configured to detect when the ADPLL is locked and provide a lock signal to the BIST when the ADPLL is locked; and
wherein, in the second operational mode, the BIST is further configured to provide a minimum and a maximum control word to the DCO circuit;
receive the divider output signal from the frequency divider circuit,
receive the time signal from the TDC circuit, and
determine whether the lock signal is set and analyze the outputs from the TDC circuit and divider circuit.

7. The ADPLL of claim 4 further comprising:
a time-to-digital converter circuit (TDC), coupled to the output of the DCO and an input of the BIST, and configured to measure a time interval between a reference edge and an edge of a DCO-related signal and output a time signal corresponding to the measured time interval;
a lock detection circuit, coupled to the output of the phase comparator circuit and an input of the BIST, and configured to detect when the ADPLL is locked and provide a lock signal to the BIST when the ADPLL is locked; and
wherein, in the second operational mode, the BIST is further configured to provide a minimum and a maximum control word to the DCO circuit;
receive the divider output signal from the frequency divider circuit,
receive the time signal from the TDC circuit, and
determine a minimum and maximum operation frequency of the DCO by analyzing the TDC output and the divider output signal.

8. The ADPLL of claim 4 further comprising:
a time-to-digital converter (TDC) circuit, coupled to the output of the DCO and an input of the BIST, and configured to measure a time interval between a reference edge and an edge of a DCO-related signal and output a time signal corresponding to the measured time interval;
the DCO circuit further comprises an oscillator and a plurality of capacitor banks that control the output frequency of the oscillator;
wherein, in the second operational mode, the BIST is further configured to provide a first set of test signals to the DCO,
receive, in response to the first set of test signals, a first divider output signal from the divider circuit and a first time signal from the TDC circuit,
provide a second set of test signals to the DCO,
receive, in response to the second set of test signals, a second divider output signal from the divider circuit and a second time signal from the TDC circuit, and
determine a frequency difference of the DCO using the first divider output, the first time signal, the second divider output, and the second time signal.

9. The ADPLL of claim 8, wherein
the plurality of capacitor banks comprises an acquisition capacitor bank and one or more tracking capacitor banks,
the first and second sets of test signals are configured to test a target capacitor bank that comprises one of the acquisition capacitor bank or one of the tracking capacitor banks,
a difference between the first and second sets of test signals is set such that a difference in response of the DCO to the first and second sets of test signals is linear,
a normalized value of the frequency difference of the DCO is compared, by the BIST, against a predetermined constant value.

10. The ADPLL of claim 8, wherein
the plurality of capacitor banks comprises a process-voltage-temperature capacitor bank,
the first and second sets of test signals are configured to test a target capacitor bank that comprises the process-voltage-temperature capacitor bank,
the BIST is further configured to
measure a first count (C1) from the TDC circuit and divider circuit when all capacitor banks are off, a second count (C2) from the TDC circuit and divider circuit in response to the first set of test signals, and a third count (C3) from the TDC circuit and divider circuit in response to the second set of test signals,
determine whether (C1−C2)−2*(C1−C3) is less than a predetermined threshold.

11. A system on a chip (SoC) comprising:
an all-digital phase-locked loop (ADPLL) circuit comprising
a digitally-controlled oscillator circuit (DCO) configured to generate an output signal in response to a set of input signals, and a built-in self-test circuit (BIST), coupled to the inputs of the DCO, and configured to provide the set of input signals to the DCO;
one of a logic, digital signal processor (DSP), and other embedded processor in the SoC, coupled to the BIST, and configured to initiate BIST-based testing of the ADPLL and receive data associated with results of the BIST-based testing of the ADPLL.

12. The SoC of claim 11 wherein the ADPLL further comprises:
a frequency divider circuit, coupled to the output of the DCO and an input of the BIST, and configured to generate a divider output signal that is a desired frequency from the DCO output signal;
a phase comparator circuit, coupled to the output of the frequency divider circuit, and configured to
compare the divider output signal to a reference frequency, and
generate a phase difference signal corresponding to a phase difference between the divider output and the reference frequency; and
a loop filter circuit, coupled to the output of the phase comparator circuit and inputs to the BIST, and configured to generate a set of input signals for the BIST using the phase difference signal.

13. The SoC of claim 12, wherein, in a first operational mode, the BIST is configured to provide the set of input signals for the BIST to the set of input signals to the DCO.

14. The SoC of claim 12, wherein, in a second operational mode, the BIST is configured to:
generate one or more test signals; and
provide the one or more test signals as members of the set of input signals to the DCO.

15. The SoC of claim 14, wherein the ADPLL further comprises:
a time-to-digital converter (TDC) circuit, coupled to the output of the DCO and an input of the BIST, and configured to measure a time interval between a reference edge and an edge of a DCO-related signal and output a time signal corresponding to the measured time interval; and
wherein, in the second operational mode, the BIST is configured to
detect whether each bit of the TDC output can switch values from a zero to a one and from a one to a zero, record results of said detecting.

16. The SoC of claim 14, wherein the ADPLL further comprises:
a time-to-digital converter circuit, coupled to the output of the DCO and an input of the BIST, and configured to measure a time interval between a reference edge and an edge of a DCO-related signal and output a time signal corresponding to the measured time interval;
a lock detection circuit, coupled to the output of the phase comparator circuit and an input of the BIST, and configured to detect when the ADPLL is locked and provide a lock signal to the BIST when the ADPLL is locked; and
wherein, in the second operational mode, the BIST is configured to provide a minimum and a maximum control word to the DCO circuit;
receive the divider output signal from the frequency divider circuit,
receive the time signal from the time-to-digital converter circuit, and
determine whether the lock signal is set and analyze the outputs from the time-to-digital converter circuit and divider circuit.

17. The SoC of claim 14, wherein the ADPLL further comprises:
a time-to-digital converter (TDC) circuit, coupled to the output of the DCO and an input of the BIST, and configured to measure a time interval between a reference edge and an edge of a DCO-related signal and output a time signal corresponding to the measured time interval;
the DCO circuit further comprises an oscillator and a plurality of capacitor banks that control the output frequency of the oscillator;
wherein, in the second operational mode, the BIST is further configured to provide a first set of test signals to the DCO,
receive, in response to the first set of test signals, a first divider output signal from the divider circuit and a first time signal from the TDC circuit,
provide a second set of test signals to the DCO,
receive, in response to the second set of test signals, a second divider output signal from the divider circuit and a second time signal from the TDC circuit,
determine a frequency difference of the DCO using the first divider output, the first time signal, the second divider output, and the second time signal.

18. The SoC of claim 17, wherein
the plurality of capacitor banks comprises an acquisition capacitor bank and one or more tracking capacitor banks,
the first and second sets of test signals are configured to test a target capacitor bank that comprises one of the acquisition capacitor bank or one of the tracking capacitor banks,
a difference between the first and second sets of test signals is set such that a difference in response of the DCO to the first and second sets of test signals is linear,
a normalized value of the frequency difference of the DCO is compared, by the BIST, against a predetermined constant value.

19. The SoC of claim 17, wherein
the plurality of capacitor banks comprises a process-voltage-temperature capacitor bank,
the first and second sets of test signals are configured to test a target capacitor bank that comprises the process-voltage-temperature capacitor bank,
the BIST is further configured to
measure a first count (C1) from the TDC circuit and divider circuit when all capacitor banks are off, a second count (C2) from the TDC circuit and divider circuit in response to the first set of test signals, and a third count (C3) from the TDC circuit and divider circuit in response to the second set of test signals,
determine whether (C1−C2)−2*(C1−C3) is less than a predetermined threshold.

20. The SoC of claim 11, wherein
the logic, DSP, or other type of embedded processor is configured to initiate BIST-based testing of the ADPLL during one of initialization of the SoC and in-field testing of the SoC.

* * * * *